United States Patent
Choi et al.

(10) Patent No.: US 8,149,404 B2
(45) Date of Patent: Apr. 3, 2012

(54) METHOD FOR ALIGNING WAFER AND ALIGNMENT APPARATUS USING THE METHOD

(75) Inventors: Young-shin Choi, Cheonan-si (KR); Ki-kwon Jeong, Cheonan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 544 days.

(21) Appl. No.: 12/370,251

(22) Filed: Feb. 12, 2009

(65) Prior Publication Data

US 2009/0310137 A1     Dec. 17, 2009

(30) Foreign Application Priority Data

Jun. 13, 2008  (KR) ........................ 10-2008-0055834

(51) Int. Cl.
*G01B 11/00* (2006.01)
(52) U.S. Cl. ........ 356/401; 356/399; 382/145; 382/149; 324/750.16
(58) Field of Classification Search .......... 356/399–401; 382/145–149
See application file for complete search history.

(56) References Cited

U.S. PATENT DOCUMENTS

| | | | |
|---|---|---|---|
| 2005/0013476 A1* | 1/2005 | Simpkins | 382/151 |
| 2005/0140960 A1* | 6/2005 | Andreas Hazenberg et al. | 355/72 |
| 2008/0068618 A1* | 3/2008 | Kagami | 356/620 |

FOREIGN PATENT DOCUMENTS

| | | |
|---|---|---|
| JP | 2001-196326 | 7/2001 |
| KR | 100246897 | 12/1999 |
| KR | 1020050116422 | 12/2005 |

* cited by examiner

*Primary Examiner* — Tarifur Chowdhury
*Assistant Examiner* — Isiaka Akanbi
(74) *Attorney, Agent, or Firm* — F. Chau & Associates, LLC

(57) ABSTRACT

A method of aligning a wafer includes recognizing images of the wafer accommodated on a work table and a notch of the wafer using a camera, designating at least one notch point of the notch in a recognized image, producing at least one reference line using the designated notch point in the recognized image, designating a center point of the reference line in the recognized image, producing an imaginary line having an angle with respect to the reference line from the center point of the reference line in the recognized image, producing a center line of the wafer using the imaginary line in the recognized image, and aligning the wafer using an alignment apparatus to allow the center line of the wafer and an alignment line of the work table to be matched.

16 Claims, 5 Drawing Sheets

METHOD FOR ALIGNING WAFER AND ALIGNMENT APPARATUS USING THE METHOD

CROSS-REFERENCE TO RELATED APPLICATIONS

This application claims the benefit of Korean Patent Application No. 10-2008-0055834, filed on Jun. 13, 2008, the disclosure of which is hereby incorporated by reference herein in its entirety.

BACKGROUND

1. Technical Field

The present invention relates to a method of aligning a wafer and an alignment apparatus using the method, and more particularly, to a method of aligning a wafer which can prevent a defect from occurring during processing a wafer due to a recognition error by improving a recognition rate of the equipment, and to an alignment apparatus using the method.

2. Description of the Related Art

In general, a wafer may be cut into a plurality of semiconductor chips using a sawing apparatus that uses a blade or a laser beam. The wafer accommodated on a wafer chuck table of the sawing apparatus may be recognized using a camera installed in the sawing apparatus. The sawing apparatus also includes an alignment apparatus for aligning a reference line of the wafer with an alignment line of the wafer chuck table by reading an image.

A conventional alignment apparatus generally employs a method of producing the center line of a wafer by recognizing a ball or line formed on a surface of the wafer using a camera. However, according to the conventional wafer alignment method, when the ball or line formed on the surface of the wafer is deformed, a recognition error may be generated so that a sawing defect may be generated. Furthermore, as a resin layer is coated on the surface of the wafer to protect the surface of the wafer, the camera may have difficulty recognizing an align key or a pattern such as the ball or line on the surface of the wafer so the wafer may not be aligned.

SUMMARY OF THE INVENTION

Exemplary embodiments of the present invention may provide a method of aligning a wafer that can improve a recognition rate and precision of the apparatus and prevent a recognition error from being generated using three points (a center point, a first imaginary point, and a second imaginary point) so that a wafer process defect in the subsequent process can be prevented in advance.

Exemplary embodiments of the present invention may provide an alignment apparatus using the method.

In accordance with an exemplary embodiment of the present invention, a method of aligning a wafer is provided. The method includes recognizing images of the wafer accommodated on a work table and a notch of the wafer using a camera, designating at least one notch point of the notch in a recognized image, producing at least one reference line using the designated notch point in the recognized image, designating a center point of the reference line in the recognized image, producing an imaginary line having an angle with respect to the reference line from the center point of the reference line in the recognized image, producing a center line of the wafer using the imaginary line in the recognized image, and aligning the wafer using an alignment apparatus to allow the center line of the wafer and an alignment line of the work table to be matched.

The notch point may comprise a first entrance point of the notch and a second entrance point of the notch.

The reference line may be a straight line connecting the first entrance point and the second entrance point.

The center point of the reference line may be a point on the reference line that is equidistant from the first and second entrance points.

The imaginary line may comprise a first imaginary line passing the center point of the reference line and making an angle to the left side of the wafer with respect to the reference line, and a second imaginary line passing the center point of the reference line and making an angle to the right side of the wafer with respect to the reference line.

In the producing of the center line, a third imaginary line linearly connecting a first imaginary point where the first imaginary line meets a circumference of the wafer and a second imaginary point where the second imaginary line meets the circumference of the wafer is produced, and a center line may be produced by connecting a center point of the third imaginary line and the center point of the reference line.

Each of the angles of the first and second imaginary lines with respect to the reference line may be about 60°.

The imaginary line may be a normal that passes the center point of the reference line at an angle of about 90° with respect to the reference line in a direction toward the wafer.

In the producing of the center line, a center line matching the imaginary line may be produced.

In accordance with an exemplary embodiment of the present invention, a wafer alignment apparatus is provided. The wafer alignment apparatus includes an image recognition portion recognizing images of the wafer accommodated on a work table and a notch of the wafer using a camera, a notch point designating portion designating at least one notch point of the notch in a recognized image, a reference line production portion producing at least one reference line using the designated notch point in the recognized image, a center point designating portion designating a center point of the reference line in the recognized image, an imaginary line production portion producing an imaginary line having an angle with respect to the reference line from the center point of the reference line in the recognized image, a center line production portion producing a center line of the wafer using the imaginary line in the recognized image, and a control portion aligning the wafer using an alignment apparatus to allow the center line of the wafer and an alignment line of the work table to be matched.

The notch point may comprise a first entrance point of the notch and a second entrance point of the notch, the reference line is a straight line connecting the first entrance point and the second entrance point, the center point of the reference line is a point on the reference line that is equidistant from the first and second entrance points, the imaginary line comprises a first imaginary line passing the center point of the reference line and making an angle to the left side of the wafer with respect to the reference line and a second imaginary line passing the center point of the reference line and making an angle to the right side of the wafer with respect to the reference line, and the center line is a line that produces a third imaginary line linearly connecting a first imaginary point where the first imaginary line meets a circumference of the wafer and a second imaginary point where the second imaginary line meets the circumference of the wafer, and connects a center point of the third imaginary line and the center point of the reference line.

The control portion may be connected to a display portion displaying the recognized image.

The work table may be a wafer chuck table of a sawing apparatus.

The wafer may be coated with a resin layer.

BRIEF DESCRIPTION OF THE DRAWINGS

Exemplary embodiments of the present invention can be understood in more detail from the following description taken in conjunction with the accompanying drawings in which.

DETAILED DESCRIPTION OF THE EXEMPLARY EMBODIMENTS OF THE INVENTION

Figure 1:
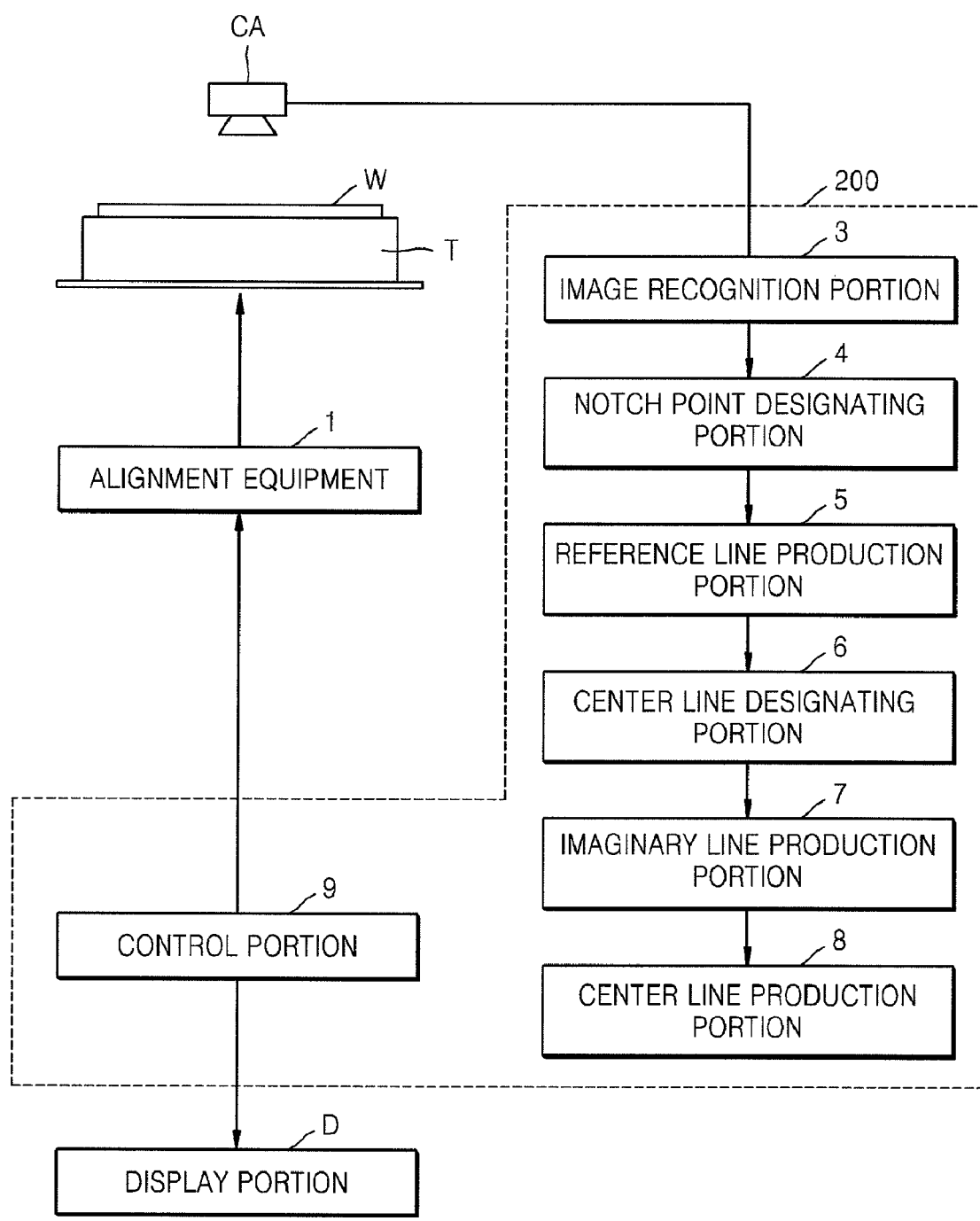
FIG. 1 is a block diagram of a wafer alignment equipment according to an exemplary embodiment of the present invention.

The attached drawings for illustrating exemplary embodiments of the present invention are referred to for gaining a sufficient understanding of the present invention, the merits thereof, and the objectives accomplished by the implementation of the inventive concept. Hereinafter, the present invention will be described in detail by explaining exemplary embodiments of the present invention with reference to the attached drawings. Like reference numerals in the drawings denote like elements.

Figure 6:
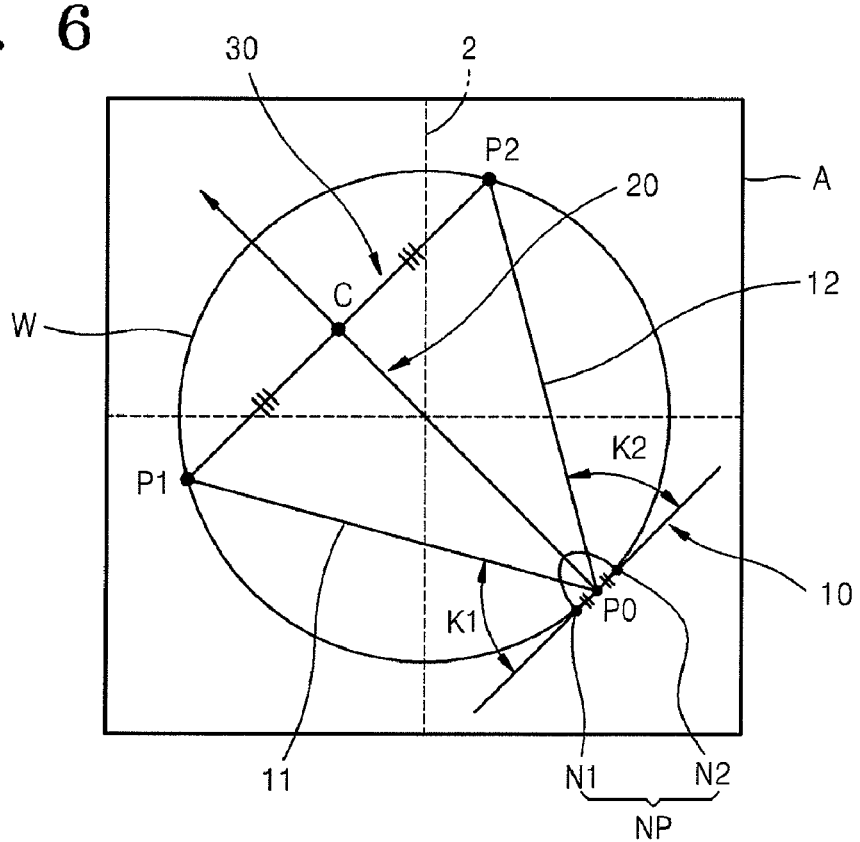

FIG. 1 is a block diagram of a wafer alignment equipment according to an exemplary embodiment of the present invention. FIG. 6 illustrates an image recognition area A of a camera CA of the wafer alignment equipment of FIG. 1. Referring to FIGS. 1 and 6, a wafer alignment apparatus 200 according to an exemplary embodiment of the inventive concept includes an image recognition portion 3, a notch point designating portion 4, a reference line production portion 5, a center point designating portion 6, an imaginary line production portion 7, a center line production portion 8, and a control portion 9.

The image recognition portion 3 is a circuit or program recognizing an image of a notch N or a wafer W accommodated on a work table T, using the camera CA. Also, the notch point designating portion 3 is a circuit or program designating at least one notch point NP of the notch N in a recognized image. The reference line production portion 5 is a circuit or program producing at least one reference line 10 using the notch point NP in the recognized image.

The center point designating portion 6 is a circuit or program designating a center point P0 on the reference line 10 in the recognized image. The imaginary line production portion 7 is a circuit or program producing imaginary lines 11 and 12, respectively, having angles K1 and K2 with respect to the reference line 10 from the center point P0 in the recognized image.

The center line production portion 8 is a circuit or program producing a center line 20 of the wafer W using the imaginary lines 11 and 12. Also, the control portion 9 is a circuit or program aligning the wafer W by applying a control signal to the alignment apparatus 1 to align an alignment line 2 of the work table T with the center line 20 of the wafer W. The alignment apparatus 1 may be a variety of alignment apparatuses capable of rotating or moving a wafer, for example, various robot arms, robot chucks, or alignment rollers.

Referring to FIG. 6, the notch point NP includes a first entrance point N1 of the notch N and a second entrance point N2 of the notch N. The reference line 10 is a straight line connecting the first entrance point N1 and the second entrance point N2. The center point P0 is a point on the reference line 10 that is equidistant from the first and second entrance points N1 and N2. The imaginary lines 11 and 12, respectively, are the first imaginary line 11 forming the angle K1 in the left direction of the wafer W with respect to the reference line 10 and the second imaginary line 12 forming the angle K2 in the right direction of the wafer W with respect to the reference line 10.

The center line 20 produces a third imaginary line 30 linearly connecting the first imaginary point P1 where the first imaginary line 11 meets the circumference of the wafer W and the second imaginary point P2 where the second imaginary line 12 meets the circumference of the wafer W. Also, the center line 20 is a straight line connecting the center point C of the third imaginary line 30 and the center point P0 of the reference line 10. Each of the angles K1 and K2 is about 60° so that the produced three points, that is, the center point P0, the first imaginary point P1, and the second imaginary point P2, form a regular triangle.

The control portion 9 is connected to a display portion D that displays the recognized image so that a user can check the recognized image. The work table T may be a work table of any apparatuses needing wafer alignment. For example, a wafer chuck table of a sawing apparatus may be used as the work table T. Thus, the method of aligning a wafer using a wafer alignment apparatus according to an exemplary embodiment of the present invention will be described below step by step.

Figure 2:
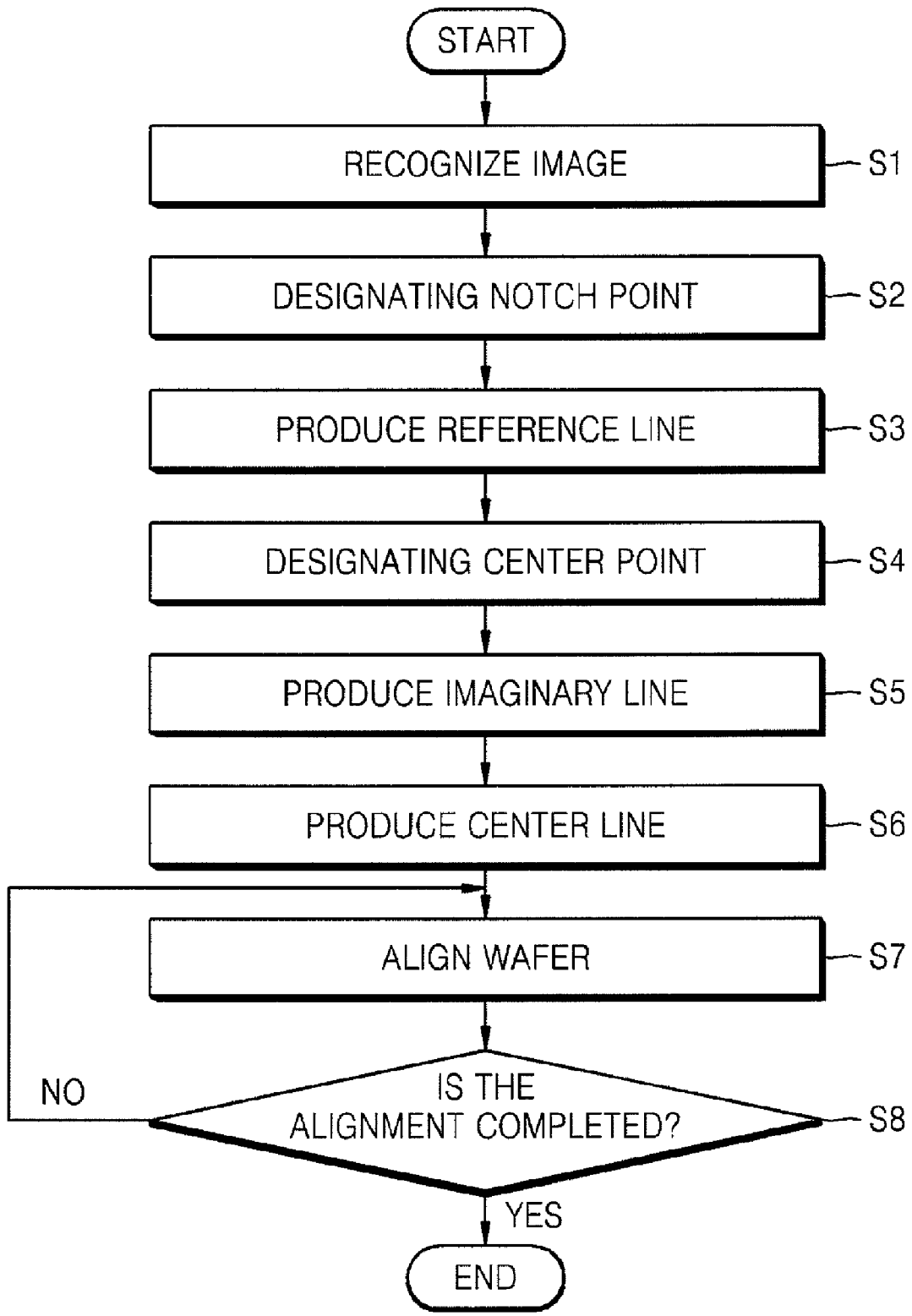
FIG. 2 is a flowchart for explaining a wafer alignment method according to an exemplary embodiment of the present invention.

FIG. 2 is a flowchart for explaining a wafer alignment method according to an exemplary embodiment of the present invention. FIGS. 3-7 illustrate the wafer alignment method of FIG. 2 step by step. Referring to FIG. 2, a method of aligning a wafer according to an exemplary embodiment of the inventive concept includes recognizing an image (S1), designating a notch point (S2), producing a reference line (S3), designating a center point (S4), producing an imaginary line (S5), producing a center line (S6), and aligning a wafer (S7).

Figure 3:
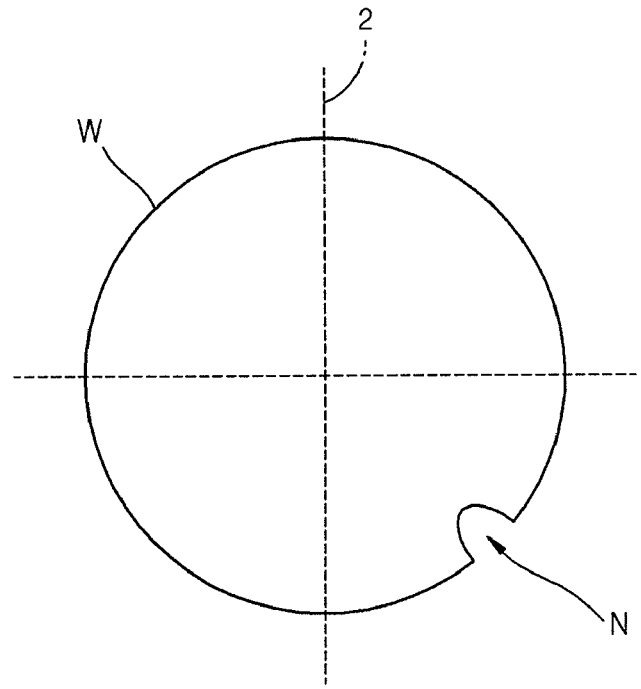
FIGS. 3-7 illustrate the wafer alignment method of FIG. 2, step by step.
Figure 4:
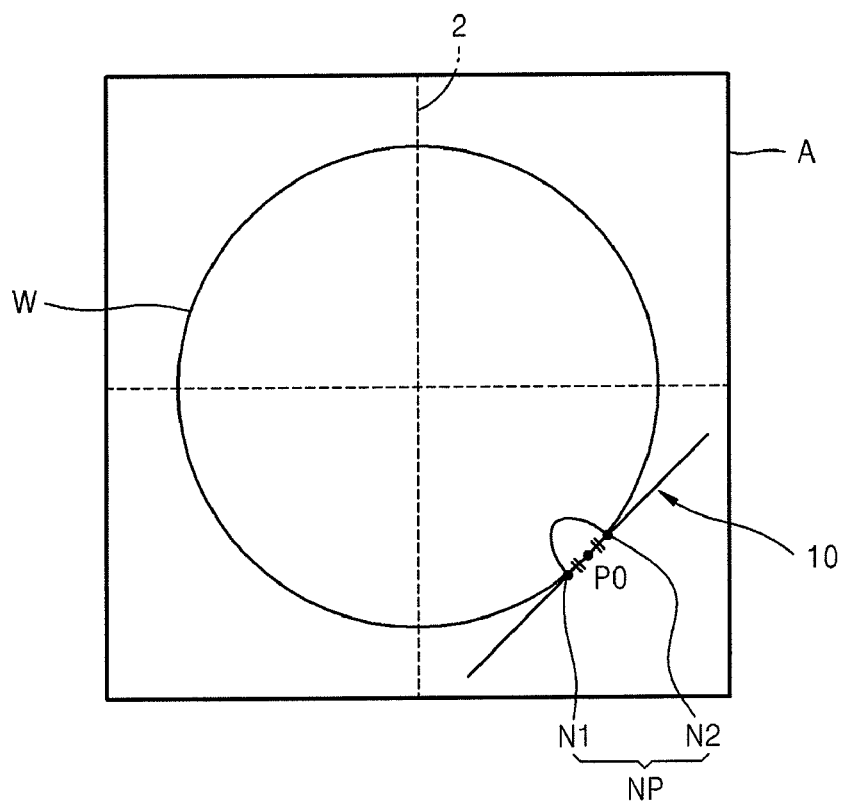

Referring to FIG. 3, in the image recognition operation S1, the image of the notch N and the wafer W accommodated on the work table T in an unaligned state are recognized using the camera CA. Referring to FIG. 4, in the notch point designating operation S2, at least one notch point NP of the notch N is designated in the recognized image. The notch point NP includes the first entrance point N1 of the notch N and the second entrance point N2 of the notch N. The first and second entrance points N1 and N2 are points where the entrance of the notch N starts and ends on the circumference of the wafer W. The first and second entrance points N1 and N2 may be recognized as two sharp points where the circumference of the wafer W and an outline of the notch N meet even when the entrance of the notch N is abraded or damaged.

Referring to FIG. 4, in the reference line production operation S3, the at least one reference line 10 is produced using the notch point NP in the recognized image. The reference line 10 is a straight line connecting the first and second entrance points N1 and N2.

Referring to FIG. 4, in the center point designating operation S4, the center point P0 of the reference line 10 is designated in the recognized image. The center point P0 is a point on the reference line 10 that is equidistant from the first and second entrance points N1 and N2.

Figure 5:
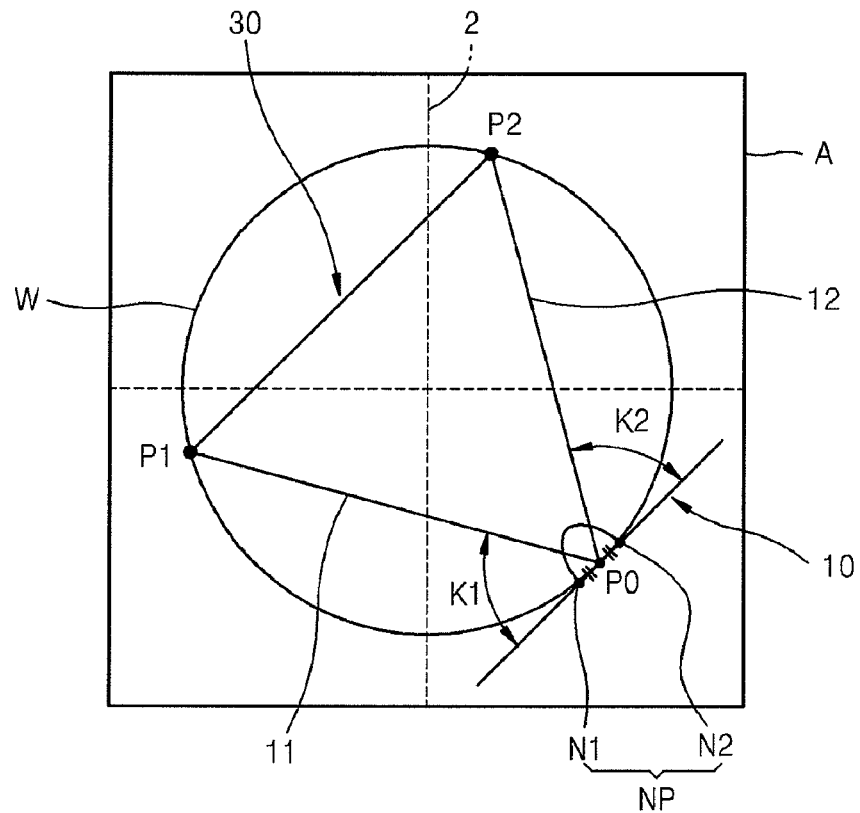

Referring to FIG. 5, in the imaginary line production operation S5, the imaginary lines 11 and 12, respectively, having the angles K1 and K2 from the center point P0 with respect to the reference line 10, are produced in the recognized image. The imaginary lines 11 and 12, respectively, are the first imaginary line 11 forming the angle K1 in the left direction of the wafer W with respect to the reference line 10 and the second imaginary line 12 forming the angle K2 in the right direction of the wafer W with respect to the reference line 10.

Referring to FIG. 6, in the center line production operation S6, the center line 20 of the wafer W is produced using the imaginary lines 11 and 12. Also, the third imaginary line 30 linearly connecting the first imaginary point P1 where the first imaginary line 11 meets the circumference of the wafer W and the second imaginary point P2 where the second imaginary line 12 meets the circumference of the wafer W is produced. Also, the center line 20 is produced by connecting the center point C of the third imaginary line 30 and the center point P0 of the reference line 10.

Each of the angle K1 of the first imaginary line 11 and the angle K2 of the second imaginary line 12 is about 60° so that the three points, that is, the center point P0, the first imaginary point P1, and the second imaginary point P2, form a regular triangle. The angles K1 and K2 may be diversely changed, for example, about 30° or about 45°.

Figure 7:
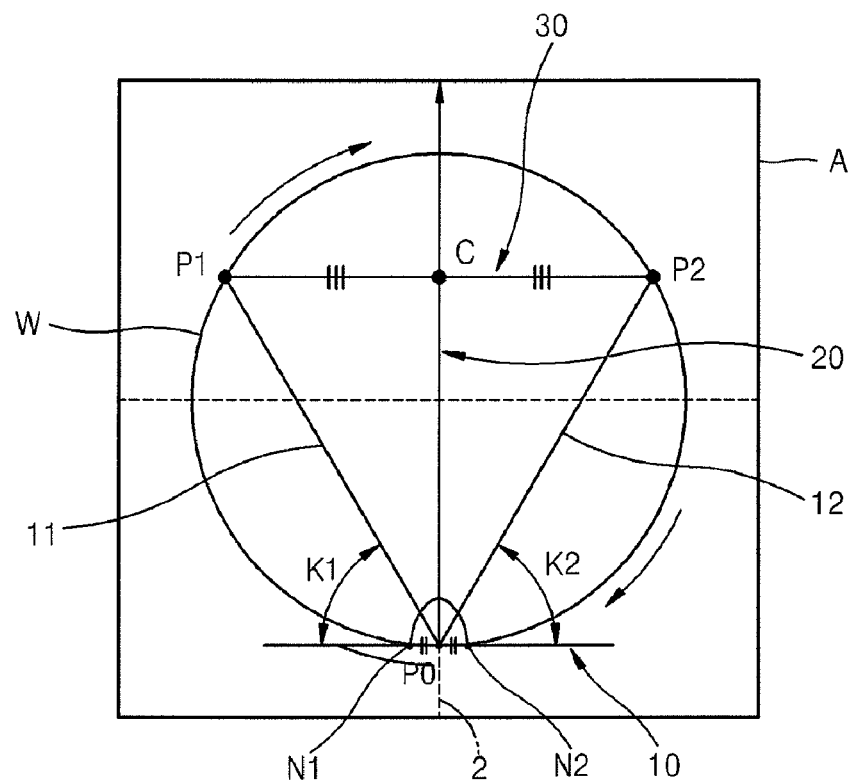

Referring to FIG. 7, in the wafer alignment operation S7, the wafer W is aligned using the alignment apparatus 1 of FIG. 1 such that an alignment line 2 of the work table T can be aligned with the center line 20 of the wafer W. As shown in FIG. 2, the wafer alignment operation S7 is repeated until the alignment is completed, by checking whether the alignment is completed (S8).

Figure 8:
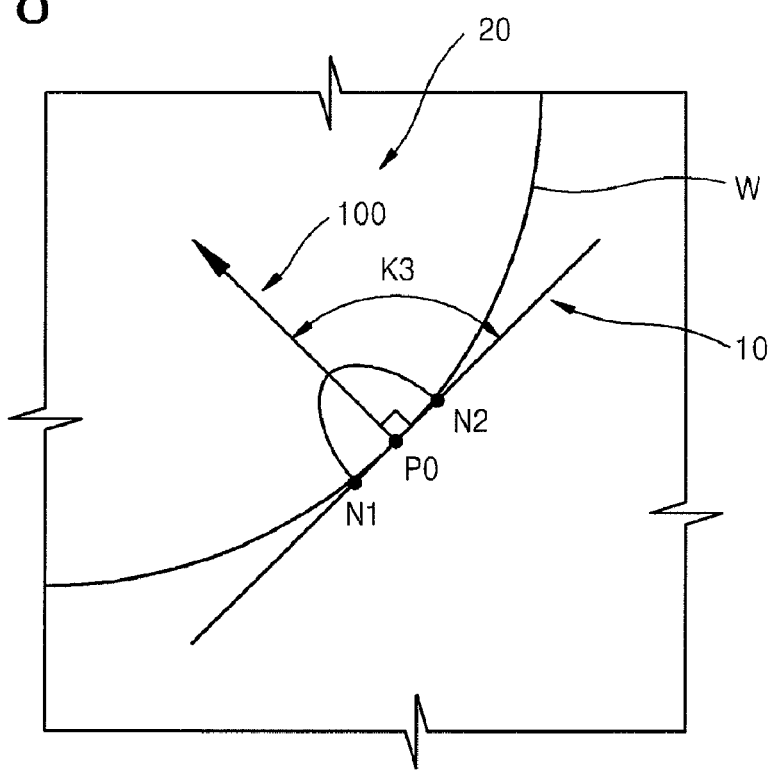
FIG. 8 illustrates a wafer alignment method according to an exemplary embodiment of the present invention.

FIG. 8 illustrates a wafer alignment method according to another exemplary embodiment of the present invention. Referring to FIG. 8, the imaginary line 100 may be a normal that originates from the center point P0 at an angle K3 of about 90° with respect to the reference line 10. That is, without designating the three points, the imaginary line 100 is produced with respect to the center point 10. The center line 20 can be produced by matching the imaginary line 100 and the center line 20.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of aligning a wafer, the method comprising:
   recognizing images of the wafer accommodated on a work table and a notch of the wafer using a camera;
   designating at least one notch point of the notch in a recognized image;
   producing at least one reference line using the designated notch point in the recognized image;
   designating a center point of the reference line in the recognized image, wherein the center point of the reference line is located in the notch;
   producing a first imaginary line making an angle to the left side of the wafer from the center point of the reference line in the recognized image with respect to the reference line; and a second imaginary line making an angle to the right side of the wafer from the center point of the reference line in the recognized image with respect to the reference line;
   producing a center line of the wafer using the imaginary line in the recognized image; and aligning the wafer using an alignment apparatus to allow the center line of the wafer and an alignment line of the work table to be matched.

2. The method of claim 1, wherein the notch point comprises a first entrance point of the notch and a second entrance point of the notch.

3. The method of claim 2, wherein the reference line is a straight line connecting the first entrance point and the second entrance point.

4. The method of claim 3, wherein the center point of the reference line is a point on the reference line that is equidistant from the first and second entrance points.

5. The method of claim 1, wherein, in the producing of the center line, a third imaginary line linearly connecting a first imaginary point where the first imaginary line meets a circumference of the wafer and a second imaginary point where the second imaginary line meets the circumference of the wafer is produced, and a center line is produced by connecting a center point of the third imaginary line and the center point of the reference line.

6. The method of claim 1, wherein each of the angles of the first and second imaginary lines with respect to the reference line is about 60° C.

7. The method of claim 1, wherein the aligning of the wafer is repeated until the alignment is completed by checking whether the alignment is completed.

8. A wafer alignment apparatus comprising:
   an image recognition portion recognizing images of the wafer accommodated on a work table and a notch of the wafer using a camera;
   a notch point designating portion designating at least one notch point of the notch in a recognized image;
   a reference line production portion producing at least one reference line using the designated notch point in the recognized image;
   a center point designating portion designating a center point of the reference line in the recognized image, wherein the center point of the reference line is located in the notch;
   an imaginary line production portion producing a first imaginary line making an angle to the left side of the wafer from the center point of the reference line in the recognized image with respect to the reference line; and a second imaginary line making an angle to the right side of the wafer from the center point of the reference line in the recognized image with respect to the reference line;
   a center line production portion producing a center line of the wafer using the imaginary line in the recognized image; and a control portion aligning the wafer using an alignment apparatus to allow the center line of the wafer and an alignment line of the work table to be matched.

9. The wafer alignment apparatus of claim 8, wherein the notch point comprises a first entrance point of the notch and a second entrance point of the notch, the reference line is a straight line connecting the first entrance point and the second entrance point, the center point of the reference line is a point on the reference line that is equidistant from the first and second entrance points, and the center line is a line that produces a third imaginary line linearly connecting a first imaginary point where the first imaginary line meets a circumference of the wafer and a second imaginary point where the second imaginary line meets the circumference of the wafer, and connects a center point of the third imaginary line and the center point of the reference line.

10. The wafer alignment apparatus of claim 9, wherein each of the angles of the first and the second imaginary lines with respect to the reference line is about 60° such that the center point, the first imaginary point and the second imaginary point form a regular triangle.

11. The wafer alignment apparatus of claim 9, wherein each of the angles of the first and the second imaginary lines with respect to the reference line is about 30°.

12. The wafer alignment apparatus of claim 9, wherein each of the angles of the first and the second imaginary lines with respect to the reference line is about 45°.

13. The wafer alignment apparatus of claim 8, wherein the control portion is connected to a display portion displaying the recognized image.

14. The wafer alignment apparatus of claim 8, wherein the work table is a wafer chuck table of a sawing apparatus.

15. The wafer alignment apparatus of claim 8, wherein the wafer is coated with a resin layer.

16. The wafer alignment apparatus of claim 8, wherein the alignment apparatus is one of a robot arm, robot chuck or alignment roller.

* * * * *